US006631005B1

United States Patent
Komazaki et al.

(10) Patent No.: US 6,631,005 B1
(45) Date of Patent: Oct. 7, 2003

(54) OPTICAL DISPLACEMENT SENSOR HAVING A SEMICONDUCTOR LASER LIGHT SOURCE USING AN OPTICAL ELEMENT WHICH CAN CONTROL BEAM ANGLE AND A BEAM SHAPE

(75) Inventors: Iwao Komazaki, Urawa (JP); Eiji Yamamoto, Ome (JP)

(73) Assignee: Olympus Optical Co., Ltd., Tokyo (JP)

( * ) Notice: Subject to any disclaimer, the term of this patent is extended or adjusted under 35 U.S.C. 154(b) by 253 days.

(21) Appl. No.: 09/583,010

(22) Filed: May 30, 2000

(30) Foreign Application Priority Data

Jun. 1, 1999 (JP) ............................................. 11-153743

(51) Int. Cl.[7] ................................................. G01B 9/02
(52) U.S. Cl. ..................................................... 356/499
(58) Field of Search ................................ 356/488, 494, 356/499, 521; 250/237 G, 231.14

(56) References Cited

U.S. PATENT DOCUMENTS 4,955,718 A * 9/1990 Michel ........................ 356/499
5,657,125 A * 8/1997 Kato et al. ................... 356/499

FOREIGN PATENT DOCUMENTS

JP 2000-205819 7/2000

* cited by examiner

Primary Examiner—Samuel A. Turner
(74) Attorney, Agent, or Firm—Frishauf, Holtz, Goodman & Chick, P.C.

(57) ABSTRACT

An optical displacement sensor includes a laser light source, a scale, a photodetector, and an optical element which refracts light beams to the scale. The scale is displaced in a fashion traversing the light beams and includes a periodic pattern formed thereon to generate a diffractive interference pattern from the light beams. The photodetector receives at least a portion of the pattern and includes a photodetector array comprising plural light receiving areas having a period of $np_1(z_1+z_2)/z_1$ in a pitch direction of the pattern on a surface of the photodetector. A distance between an emission surface of the laser light source and a surface of the scale is defined as $z_1$. A distance between the surface of the scale and a light receiving surface of the photodetector is defined as $z_2$. A pitch of the periodic pattern is defined as $p_1$, and n denotes a natural number.

5 Claims, 9 Drawing Sheets

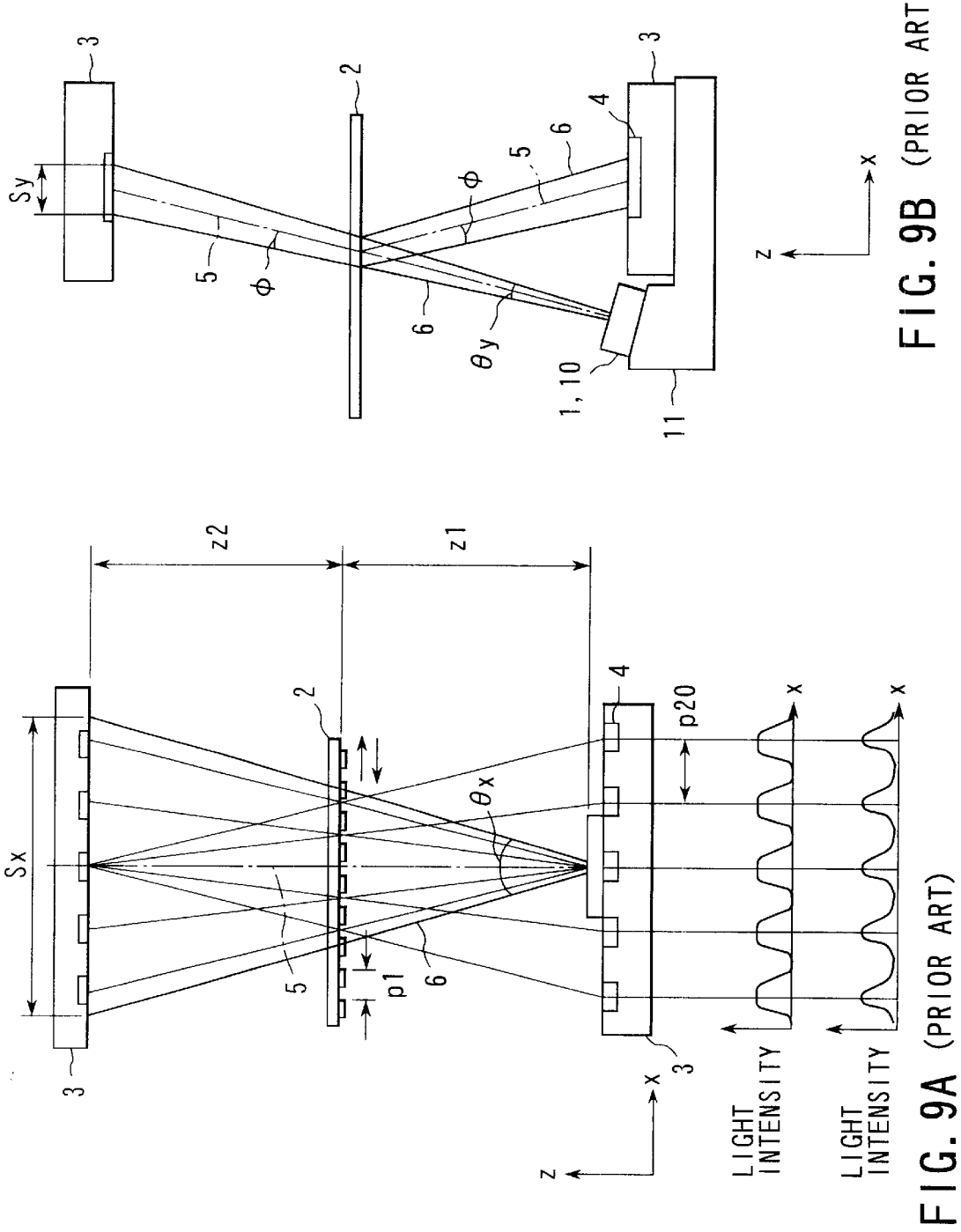

OPTICAL DISPLACEMENT SENSOR HAVING A SEMICONDUCTOR LASER LIGHT SOURCE USING AN OPTICAL ELEMENT WHICH CAN CONTROL BEAM ANGLE AND A BEAM SHAPE

CROSS-REFERENCE TO RELATED APPLICATIONS

This application is based upon claims the benefit of priority from the prior Japanese Patent Application No. 11-153743 filed Jun. 1, 1999 the entire contents of which are incorporated herein by reference.

BACKGROUND OF THE INVENTION

The present invention relates to an optical displacement sensor, and in particular, to an optical displacement sensor for detecting displacement of a precision mechanism.

First, as a conventional technique for optical displacement sensors of the above kind, the optical displacement sensor disclosed in Jpn. Pat. Application No. 11-6411 and comprising a vertical cavity surface emitting laser as a light source will be described.

The configuration and operation of the optical displacement sensor according to this conventional technique will be explained with reference to FIGS. 9A and 9B.

The optical displacement sensor according to this conventional technique is configured so that a transmissive scale 2 having a periodic pattern formed thereon is irradiated with laser beams emitted from a semiconductor laser that is a coherent light source 1 so that a particular portion of the diffraction interference pattern generated by the irradiation is detected by a photodetector 3.

The sensor operation of this type will be described below.

First, as shown in FIGS. 9A and 9B, each configuration parameter is defined as:

$z_1$: distance between the light source and a surface of the scale on which a diffraction grating is formed, $z_2$: distance between the of the scale with the diffraction grating formed thereon and a light receiving surface of the photodetector, $p_1$: pitch of the diffraction grating on the scale, $p_2$: pitch of the diffraction interference pattern on the light receiving surface of the photodetector, $\theta_x$: spread angle of light beams from the light source with respect to a pitch direction of the diffraction grating on the scale, and $\theta_y$: spread angle of light beams emitted from the light source, in a direction perpendicular to the $\theta_x$ (the spread angle of light beams refers to the angle between a pair of boundary lines 6 at each of which the light beam intensity is half of a peak value).

The "pitch of the diffraction grating on the scale" means the spatial cycle of the periodic pattern formed on the scale 2 and having its optical characteristics modulated.

In addition, the "pitch of the diffraction interference pattern on the light receiving surface of the photodetector" means the spatial cycle of the intensity distribution of the diffraction interference pattern generated on the light receiving surface of the photodetector 3.

According to the light diffraction theory, an intensity pattern similar to the grating pattern on the scale 2 is generated on the light receiving surface of the photodetector 3 when the $z_1$ and $z_2$ defined above have such a particular relationship as meets the relationship shown in the following Equation (1):

$$(1/z_1)+(1/z_2)=\lambda/kp_1^2 \tag{1}$$

where $\lambda$ denotes the wavelength of light beams emitted from the light source and k is an integer.

In this case, other configuration parameters can be used to express the pitch $p_2$ of the grating pattern on the light receiving surface as shown in the following Equation (2):

$$p_2=p_1(z_1+z_2)/z_1 \tag{2}$$

When the scale 2 is displaced in the pitch direction of the diffraction grating with respect to the light source 1, the intensity distribution of the grating pattern moves in the displacement direction of the scale 2 with the same spatial cycle maintained.

Thus, by setting the spatial cycle $p_{20}$ of light receiving areas 4 of the photodetector 3 to be equal to the value $p_2$, a periodical intensity signal is obtained from the photodetector each time the scale 2 moves in the pitch direction by the pi, thereby allowing detection of the displacement of the scale 2 in the pitch direction.

The operation of conventional displacement sensors will be explained below.

Laser beams emitted from the vertical cavity surface emitting laser that is the coherent light source 1 are formed by the diffraction grating on the scale into a diffraction interference pattern on the light receiving surface of the photodetector 3, the pattern having a constant cycle pi $(z_1+z_2)/z_1$.

Since the light receiving areas 4 on the photodetector 3, constituting light intensity-detecting means, are formed in the pitch direction of the diffraction grating at distances of $np_1 (z_1+z_2)/z_1$, these light-receiving areas detect only the same particular phase portion of the diffraction interference pattern on the light receiving surface.

When the scale 2 is displaced in the pitch direction of the diffraction grating by $x_1$, the diffraction interference pattern on the light receiving surface is displaced in the same direction by $x_2=x_1 (z_1+z_2)/z_1$. Consequently, each time the scale 2 is displaced in the pitch direction of the diffraction grating by one pitch, the light intensity-detecting means provides output signals with a periodically varying intensity.

A primary axis of light beams emitted from this surface emitting laser light source is shown at reference numeral 5, and beam boundaries at which the light beam intensity is half that of the primary axis are shown at reference numeral 6.

Additionally, a remote tangent to each of the beam boundary curves 6 is shown at reference numeral 6', and the angle between the tangents 6', which are opposed to each other with respect to the primary axis of the light beams, is defined as $\theta x$ and $\theta y$ in directions x and y, respectively, and the $\theta x$ and $\theta y$ are referred to as the spread angle of the light beams.

In the surface emitting laser, by freely setting the dimensions of an emission window in an element to vary beam diameters $\omega_{ox}$, $\omega_{oy}$ on an emission surface, the $\theta x$ and $\theta y$ can be set at ones of a broad range of values due to diffraction of the light beams.

Further, when an inclined base 11 is provided, the grating surface of the scale 2 and the light receiving surface of the photodetector 3 are inclined with respect to the primary axis of the light beams emitted from the laser light source. Accordingly, when light emitted from the laser light source 1 is reflected from a surface of the scale 2 or the photodetector 3, it can be prevented from returning to the laser light source 1 to restrain optical reflection noise in the laser light from being superposed on output signals from the sensor.

Thus, the optical displacement sensor using the vertical cavity surface emitting laser light source shown in FIGS. 9A and 9B can sense the displacement of the scale more accurately and reliably.

On the other hand, the principle on which the displacement sensor is based when the diffraction grating is irradiated with parallel beams will be described with reference to FIG. 10.

A measuring movable grating 103 is a rectangular-wave grating comprising transparent and opaque portions alternated at equal distances and mounted on a measured object in its moving direction.

On the other hand, a small fixed grating 104 having the same shape as the movable grating 103 is located opposite and close to the movable grating 103, and in this arrangement, a light source 101 applies parallel beams via a lens 102 so that transmitted beams are detected by a photodetector 106 via a lens 105.

When fringe directions of the two gratings 103, 104 are maintained exactly in parallel, the scale distance between the gratings is defined as z, the scale pitch is defined as p1, the oscillation wavelength of a laser is defined as $\lambda$, and k denotes an integer. Then, when these values are adjusted to meet the following equation:

$$z = kp1^2/\lambda \qquad (3)$$

a luminous flux entering the photodetector 106 repeatedly increases or decreases each time the measuring movable grating 103 moves by one pitch.

In this case, if the two gratings are closely contacted with each other, the modulation of-optical outputs will be 100%. Due to the presence of the movable portion, however, a certain gap is required between these gratings.

Of the above described conventional techniques, the optical displacement sensor shown in FIGS. 9A and 9B includes the inclined base 11 to incline the primary axis of light beams from the surface emitting laser light source 1 through the angle $\phi$, in order to prevent reflected light. The assembly of this sensor, however, is difficult.

Thus, it is a first object of the present invention to realize an optical displacement sensor that accepts easy planar assembly without the need to incline the light source.

Additionally, the conventional displacement sensor using parallel light beams uses the lenses 102, 105 that allow parallel beams to enter the scale so that transmitted beams focus on the photodetector, as shown in FIG. 10. Consequently, the optical axes of these lenses must be adjusted, and it is difficult to integrate them into the sensor through a semiconductor process.

In addition, the conventional displacement sensor using the vertical cavity surface emitting laser as the light source uses light penetrating a substrate in order to directly monitor the power of the light source. As a result, the oscillation wavelength is limited.

Further, the conventional displacement sensor using the vertical cavity surface emitting laser as the light source requires the inclined base 11 to be produced accurately, thereby increasing costs.

Therefore, it is a second object of the present invention to realize an inexpensive high-performance optical displacement sensor that accepts easy planar assembly and that can be integrated through a semiconductor process.

BRIEF SUMMARY OF THE INVENTION

It is an object of the present invention to achieve the above described first and second objects to provide an inexpensive optical displacement sensor that can be assembled easily and that can sense displacement of a scale accurately and reliably.

(1) To attain the above objective, according to an aspect of the present invention, there is provided an optical displacement sensor comprising:

a laser light source which emits light beams having a predetermined beam shape;

a scale that is displaced in a fashion traversing the light beams emitted from the laser light source and that includes a periodic pattern formed thereon to generate a diffractive interference pattern from the light beams;

a photodetector which receives at least a portion of the diffractive interference pattern; and an optical element which refracts the light beams emitted from the laser light source to the scale;

wherein:

the photodetector includes a photodetector array comprising plural light receiving areas having a period of $np1\,(z1+z2)/z1$ in a pitch direction of the diffractive interference pattern on a surface of the photodetector, a distance between a light beam emission surface of the laser light source and a surface of the scale is defined as z1, a distance between the surface of the scale and a light receiving surface of the photodetector is defined as z2, a pitch of the periodic pattern on the scale is defined as p1, and n denotes a natural number.

Corresponding Embodiments of the Invention

Embodiments 1 to 5, described later, correspond to this aspect of the present invention.

In the above configuration, the "periodic pattern" may be a diffraction grating having formed therein a periodic/modulation pattern for an optical characteristic such as amplitude or phase and may include any diffraction grating such as a reflection or transmission grating which generates the diffractive interference pattern on the light receiving surface.

Operation

Laser beams emitted from the laser light source with the optical element integrated therewith are formed by the periodic pattern on the scale into the diffractive interference pattern on the light receiving surface, the pattern having a constant cycle of $p1\,(z1+z2)/z1$.

Since the light receiving areas on the photodetector, constituting light intensity-detecting means, are formed at distances of $np1\,(z1+z2)/z1$, these light-receiving areas detect only the same particular phase portion of the diffractive interference pattern on the light receiving surface.

When the scale is displaced in the pitch direction by x1, the diffractive interference pattern on the light receiving surface is displaced in the same direction by $x2 = x1\,(z1+z2)/z1$. Consequently, each time the scale is displaced in the pitch direction by one pitch, the light intensity-detecting means provides output signals with a periodically varying intensity.

Light beams emitted from the laser light source having the optical element integrated therewith for bending the emission direction through a predetermined angle are inclined through a predetermined angle $\phi$ with respect to a normal to an element surface. Consequently, when light emitted from the laser light source is reflected from a surface of the scale or the photodetector, the reflected beams are prevented from returning to the laser to restrain optical reflection noise in the laser light from being superpose on output signals from the sensor.

(2) To attain the above objective, according to another aspect of the present invention, there is provided an optical displacement sensor according to (1) characterized in that the laser light source is of an edge emitting type, and in that:

the optical element is a reflection surface formed on a semiconductor substrate.

Corresponding Embodiment of the Invention

Embodiment 3, described later, corresponds to this aspect of the present invention.

Operation

A major-axis direction of beams from the edge emitting laser corresponds to the spread of the beams in a vertical direction relative to a laser junction surface on its end surface.

This beam divergence can be set at 20° or smaller by setting waveguide thickness d at 0.05 μm or smaller and Δn at 0.2 or smaller.

In addition, in a minor-axis direction, the beams spread in a horizontal direction relative to the junction surface over a predetermined stripe width.

By setting the spread beam divergence angle in the minor-axis direction at 10° or smaller, a stable single mode beam is obtained in the horizontal direction and the output of the edge emitting laser can be increased to restrain a decrease in the S/N ratio of photodetector signals.

Dry etching is used to form the reflection surface on part of a stripe waveguide in the edge emitting laser as an external mirror inclined through a predetermined beam angle so that laser beams emitted from end surfaces formed by means of dry etching are reflected from the reflection surface acting as the external mirror and then applied to the surface of the scale 2.

Additionally, a monitor element having the same structure as the laser section is provided on one of the end surfaces to monitor optical outputs from the edge emitting laser.

(3) To achieve the above objective, according to a further aspect of the present invention, there is provided an optical displacement sensor according to claim (1) wherein the optical element is a grating formed in a waveguide.

Corresponding Embodiments of the Invention

Embodiments 1 and 2, described later, correspond to this aspect of the present invention.

Operation

As shown in FIG. 2, when a beam emission angle from a normal direction of a surface of a grating 50 is defined as φ, the cycle of a grating in a waveguide is defined as Λ, the waveguide-equivalent refractive index is defined as N, and the laser oscillation wavelength is defined as λ, and if the grating is formed in such a manner as to meet the following equation:

$$\sin \phi + \lambda/\Lambda = N \quad (4)$$

then, parallel beams inclined through an angle φ are emitted.

When the pitch of the grating 50 is constant, beams are applied to the scale 2 at the predetermined beam angle φ.

Then, when the stripe width of the waveguide is set in a manner such that the beam divergence is single modal, the beam divergence angle is about 10°, so that a beam spot pattern 15 is defined on the scale surface.

This pattern does not spread in a grating direction due to the parallelism of the beams, whereas the beams spread in the vertical direction.

Movement of the scale 2 can be detected by locating the scale 2 in a fashion traversing the direction of the spread beams and locating the photodetector 3 correspondingly.

The beams are also spread by providing such a modulated grating as has an inclination and a curvature gradually varying in a waveguide advancing direction.

To obtain the effects of the grating, the waveguide length must be at least 100 μm so that a scale 15 is irradiated with beams having a small beam divergence and the angle φ meeting Equation (4).

Optical outputs from the laser light source are monitored by a similar laser structure which is provided at the other end of the waveguide.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

FIGS. 9A and 9B are diagrams useful in drawing the configuration and operation of an optical displacement sensor according to the prior art.

DETAILED DESCRIPTION OF THE INVENTION

Figure 1B:
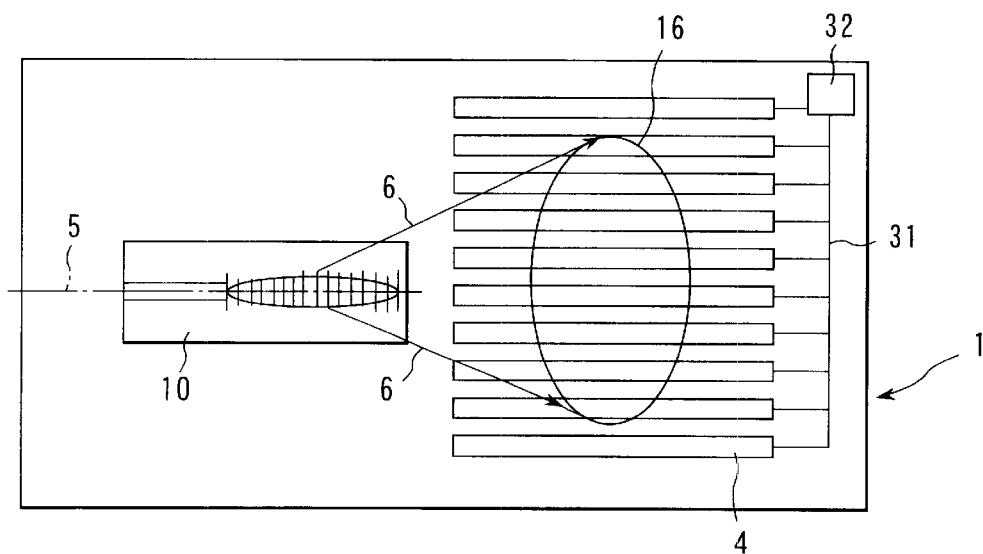
FIG. 1B is a schematic top view of an optical sensor main body 1 in FIG. 1A with a scale 2 omitted.

Reference will now be made in detail to the presently preferred embodiments of the invention as illustrated in the accompanying drawings, in which like reference numerals designate like or corresponding parts.

The embodiments of the present invention will be described below with reference to the drawings.

First Embodiment

First, an optical sensor according to a first embodiment of the present invention will be explained with reference to FIGS. 1A and 1B.

Figure 1A:
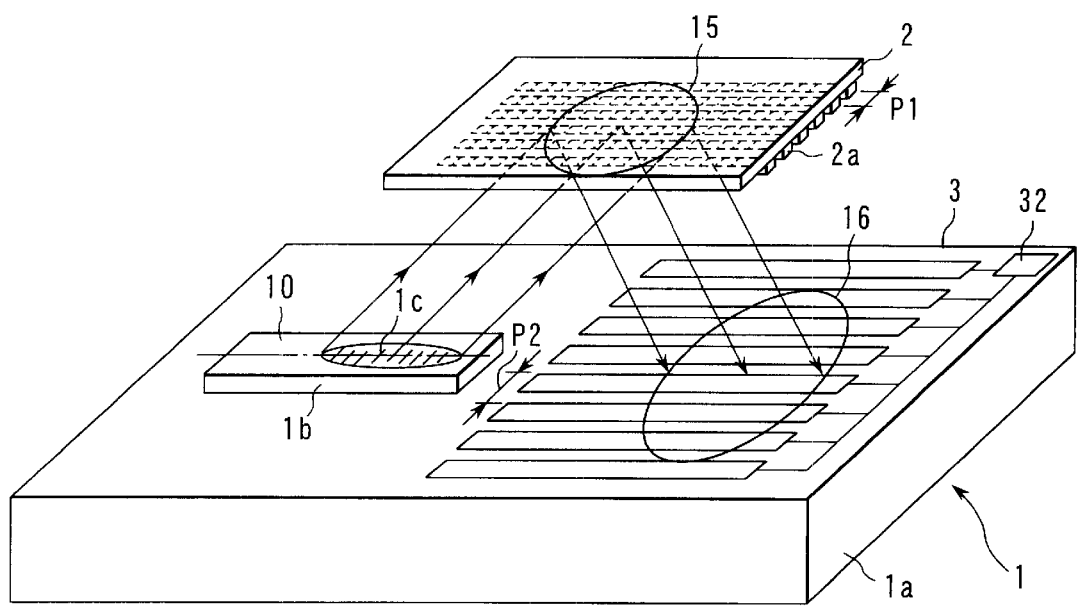
FIG. 1A is a perspective view showing a configuration of an optical sensor according to a first embodiment of the present invention.

FIG. 1A is a perspective view showing a configuration of the optical sensor according to the first embodiment of the present invention. FIG. 1B is a schematic top view of an optical sensor main body 1 in FIG. 1A with a scale 2 omitted.

The optical sensor according to the first embodiment of the present invention consists of the optical sensor main body and the scale 2 and is configured as described below.

As shown in FIGS. 1A and 1B, a laser light source 10 integrally formed by providing a grating 1c on a waveguide 1b formed on a semiconductor substrate 1a of the optical sensor main body 1 as well as the scale 2 are arranged so that a grating 2a on the scale 2 is irradiated with light beams emitted from the laser light source 10.

In addition, a photodetector 3 formed on the semiconductor substrate 1a of the optical sensor main body 1 is located to receive a predetermined portion of an interference pattern obtained when the grating 2a on the scale 2 diffracts and interferes with the light beams.

Areas 4 in FIG. 1B denote light receiving areas arranged to allow the photodetector 3 to receive the predetermined portion. If a plurality of light receiving areas 4 are arranged at a predetermined pitch p2, these areas are connected together using an electric wiring 31 so that a sensor output can be obtained from an output pad 32.

Additionally, an alternate long and short dash line 5 denotes a primary-axis center line of the light beams, and solid lines 6 denote boundary lines of the spread of the light beams.

In addition, an area 15 in FIG. 1A denotes a spread area of the light beams within a surface of the scale 2 on which the grating 2a is formed at the predetermined pitch p1.

Additionally, an area 16 in FIGS. 1A and 1B denotes a spread area of the light beams on a light receiving surface of the photodetector 3.

As described above, to maintain the visibility of a diffraction interference pattern on the light receiving surface, the surface of the optical sensor main body with the laser light source 10 formed thereon and the surface of the scale 2 with the grating 2a formed thereon as well as the light receiving surface of the photodetector 3 on the optical sensor main body are arranged and separated so as to meet the relationship indicated by Equation (1).

Figure 2:
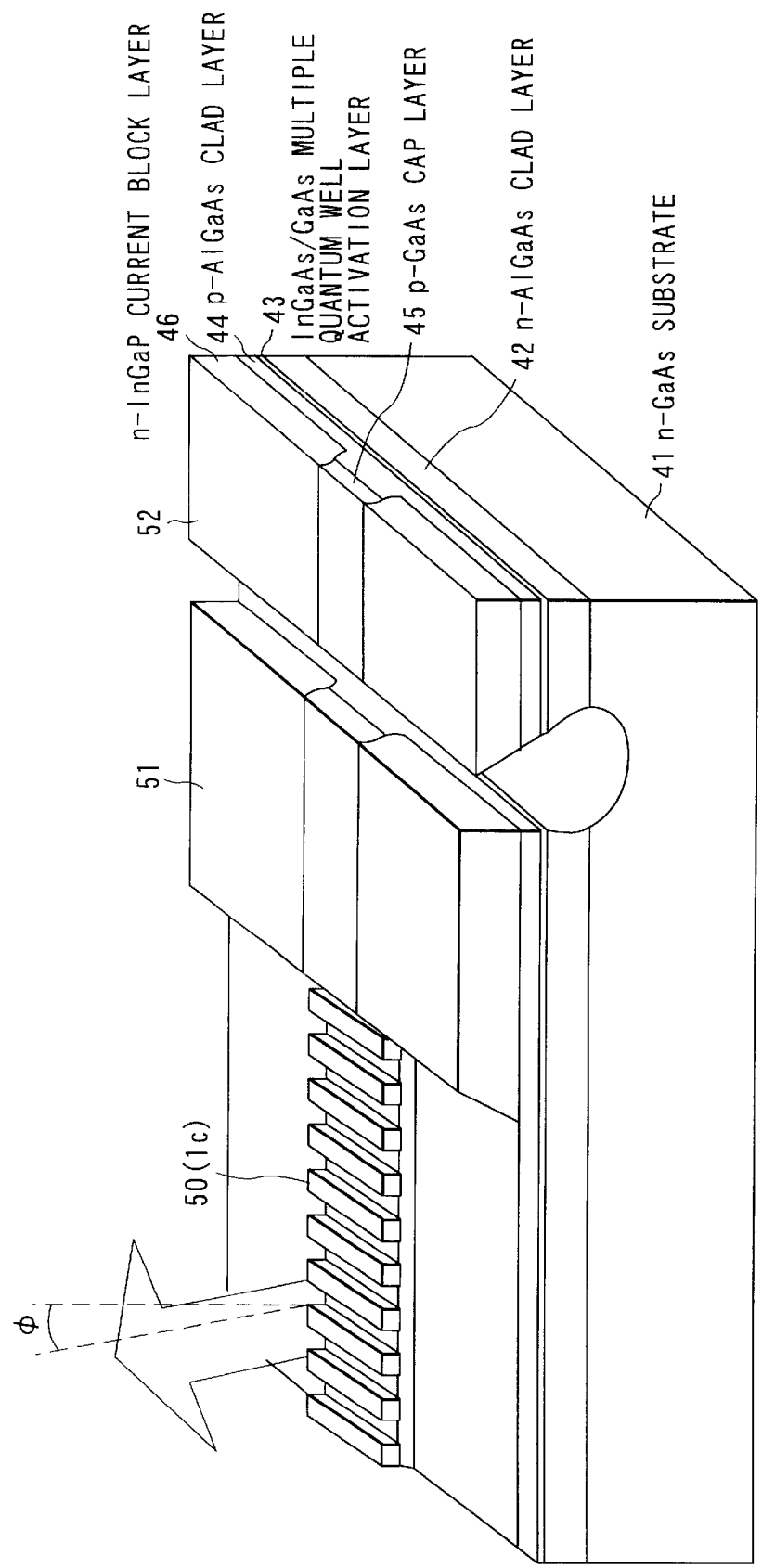
FIG. 2 is a diagram showing an example of a structure of a laser light source 10 integrally formed by providing a grating 1c in a waveguide 1b formed on a semiconductor substrate 1a in FIG. 1A.

FIG. 2 is a diagram showing an example of a structure of the laser light source 10 integrally formed by providing the grating 1c in the waveguide 1b formed on the semiconductor substrate 1.

As shown in FIG. 2, an n-AlGaAs clad layer 42, a GaAs/InGaAs double quantum well active layer (30 nm in thickness) 43, a p-AlGaAs clad layer 44, and a p-GaAs cap layer 45 are formed on an n-GaAs substrate 41 acting as the semiconductor substrate 1a.

By setting the difference in refractive index between the active layer 43 and the clad layers 42, 44 at 0.2, a wide distribution of light impregnated from the active layer 43 to the clad layers 42, 44 is obtained, waveguide absorption losses decrease, and the substrate can be coupled to a grating 50 (1c) smoothly.

Additionally, in a minor-axis direction, an n-InGap current block layer 46 is filled around a stripe with of 3 $\mu$m to set the beam divergence at about 8°.

In addition, for the waveguide length, a laser section 51 is 300 $\mu$m in thickness and a monitor section 52 is 50 $\mu$m in thickness.

The grating 50 formed using the p-AlGaAs clad layer 44 is set to have a beam inclination $\phi$ of 10°, a pitch cycle A of 0.2946 $\mu$m, a pitch height of 0.05 $\mu$m, a grating length of 250 $\mu$m, and an oscillation length $\lambda$ of 0.98 $\mu$m.

Next, the operation of the first embodiment of the present invention will be described.

Light beams emitted from the laser light source and having a predetermined light beam shape are applied to the scale 2 with the diffraction grating 2a formed thereon.

The scale 2 is displaced in such a manner as to traverse the light beams emitted from the laser light source 10.

The beams are diffracted by the scale 2 to form a diffraction interference pattern on the light receiving surface of the photodetector 3.

The photodetector 3 detects a predetermined portion of the diffraction interference pattern as a sensor signal.

The sensor signal from the photodetector 3 varies periodically in a fashion corresponding to variations in a direction in which the scale 2 traverses the light beams, thereby enabling the displacement of the scale 2 to be detected.

In order to increase the sensor signal output to improve its S/N ratio, the plurality of receiving areas 4 are integrally formed so as to have a spatial cycle p20 (see FIG. 9A) in the same direction as the pitch of the grating 2a on the scale 2 as shown in FIG. 1B.

The spatial cycle p20 of the light receiving areas is desirably the same as the cycle p2 of the diffraction interference pattern on the light receiving surface, so that the p20 is set to be substantially equal to np1 (z1+z2)/z1.

The light beams from the integrally formed laser light source 10 are emitted in a manner such that their primary axis is inclined from the scale 2 through the angle $\phi$. consequently, reflected light from the scale 2 to the laser light source 10 decreases to enable outputs from the light source to be maintained stable even if the optical distance between the laser light source 10 and the scale 2 varies slightly.

When the inclination $\phi$ is large, that is, 10° or larger, the optical path length varies significantly with the position in the diffraction interference pattern on the light receiving surface. As a result, Equation (1) is not met and the periodicity and visibility of the pattern decrease.

Thus, in practical terms, when the inclination $\phi$ of the light beams from the laser light source 10 is between about 5 and 10°, the decrease in the periodicity and visibility of the diffraction interference pattern on the light receiving surface can be minimized.

Accordingly, within this inclination range, when the p1, z1, and z2 have fixed values, the spatial cycle of the diffraction interference pattern is constant in the scale moving direction. As a result, the formation pitch of the light receiving areas may be constant in the scale moving direction, thereby facilitating design of the light receiving areas.

Second Embodiment

Next, an optical sensor according to a second embodiment of the present invention will be described.

Figure 3B:
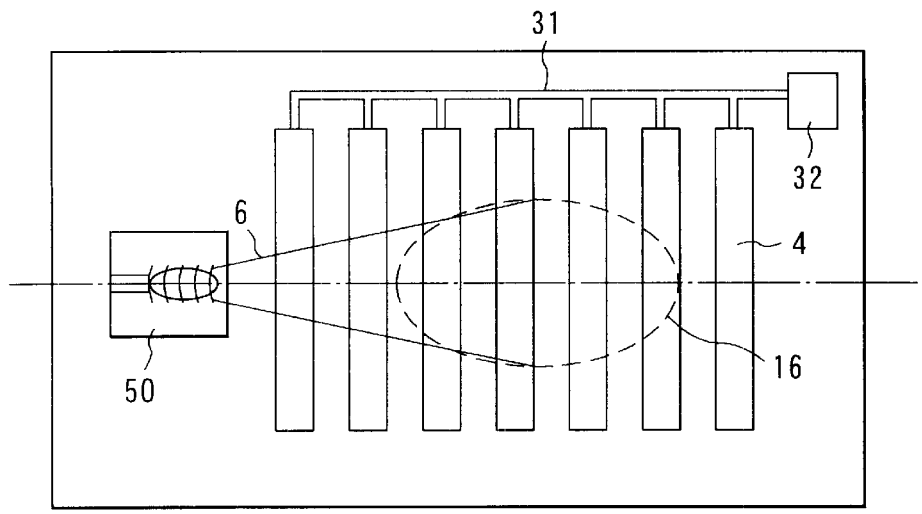
FIG. 3B is schematic top view of the optical sensor main body 1 in FIG. 3A with the scale 2 omitted.
Figure 3A:
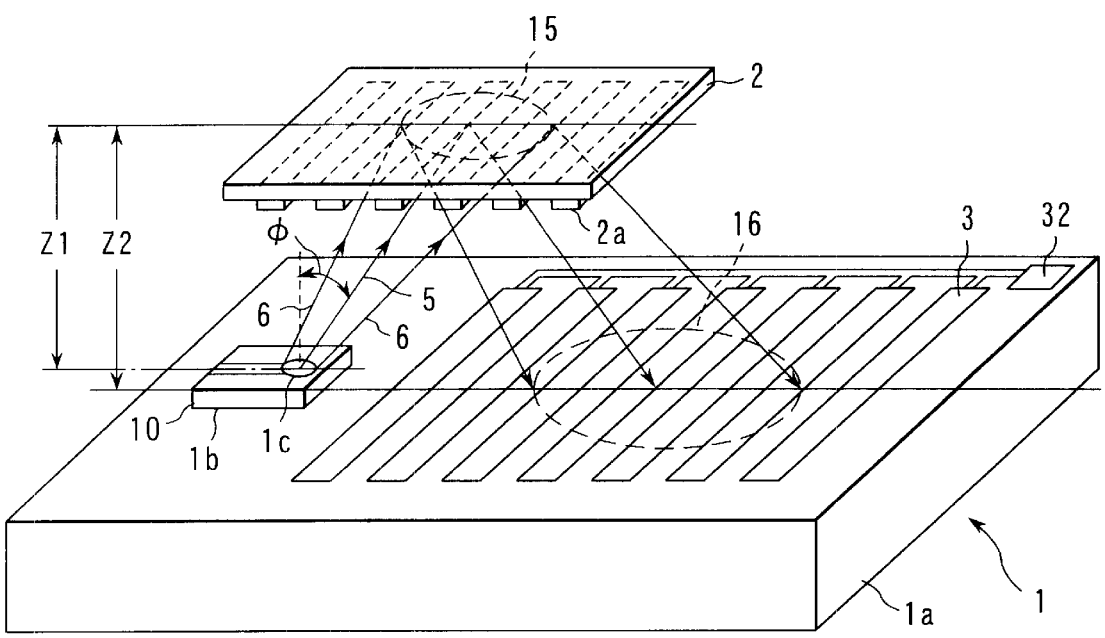
FIG. 3A is a perspective view showing a configuration of an optical sensor according to a second embodiment of the present invention.

FIG. 3A is a perspective view showing a configuration of the optical sensor according to the second embodiment. FIG. 3B is a schematic top view of an optical sensor main body 1 in FIG. 3A with the scale 2 omitted.

In the following description, some of the parts common to the first embodiments are omitted.

According to this embodiment, the diffraction grating 2a formed on the scale 2 is located so as to traverse light beams emitted at the angle φ from the grating 1c provided on the laser light source 10.

In addition, the grating 1c provided on the laser light source 10 meets Equation (4) and is configured as a modulated grating. Accordingly, the inclination and curvature of the grating 1c varies gradually along an advancing direction of the waveguide 1b so that light beams from the laser light source 10 spread.

Additionally, when the grating 1c area is large, that is, 150 μm, the spread angle of light beams from the laser light source 10 is 10° or smaller, thereby allowing the scale 2 to be irradiated with light beams similar to those from a surface emitting laser.

By locating the diffraction grating 2a on the scale 2 so as to traverse the beams and positioning the photodetector 3 parallel with the scale 2 and at the same position as the laser light source 10, the diffraction interference pattern from the scale 2 can be transferred onto the photodetector for detection to accurately detect the displacement of the scale 2.

Third Embodiment

Figure 4B:
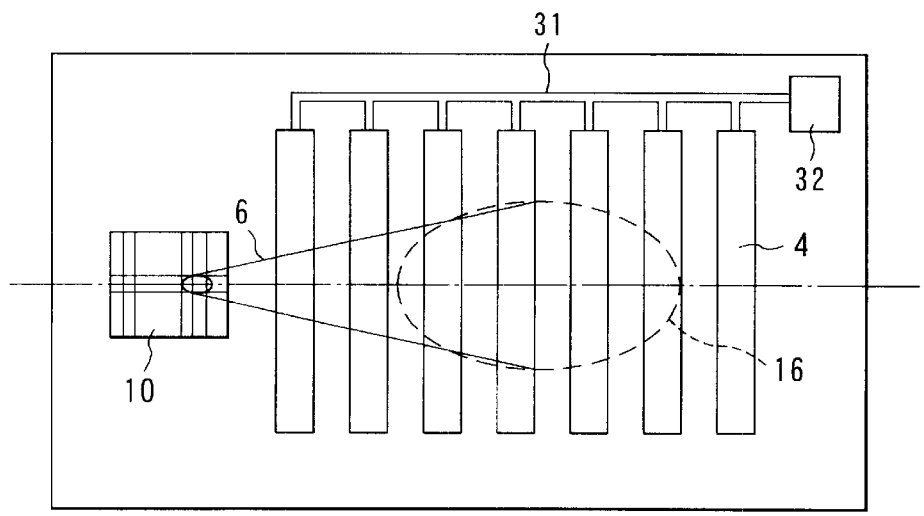
FIG. 4B is schematic top view of the optical sensor main body 1 in FIG. 3A with the scale 2 omitted.

Next, an optical sensor according to a third embodiment of the present invention will be described with reference to FIGS. 4A and 4B.

Figure 4A:
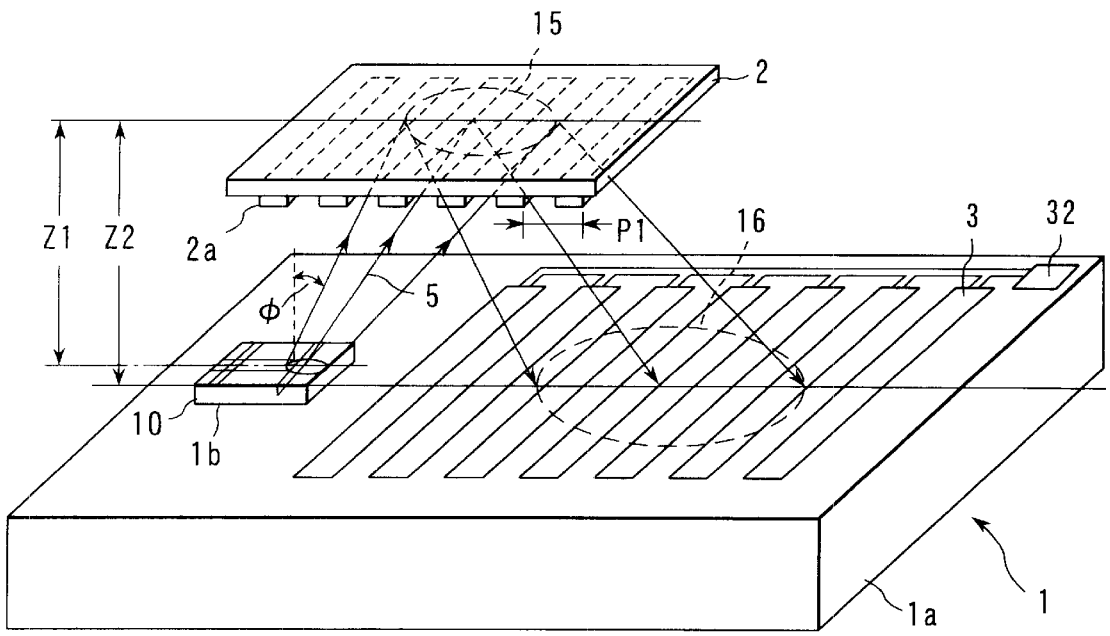
FIG. 4A is a perspective view showing a configuration of an optical sensor according to a third embodiment of the present invention.

FIG. 4A is a perspective view showing a configuration of the optical sensor according to the third embodiment. FIG. 4B is a schematic top view of the optical sensor main body 1 in FIG. 4A with the scale 2 omitted.

In the following description, some of the parts common to the first embodiment will be omitted.

In this embodiment, the laser light source 10 is an edge emitting laser. As an optical element, an external mirror is provided in an emission direction of the laser at a predetermined angle, and at the other end surface of the laser, a photodetector is integrally formed on the semiconductor substrate 1a for monitoring output light from the laser light source 10.

Figure 5:
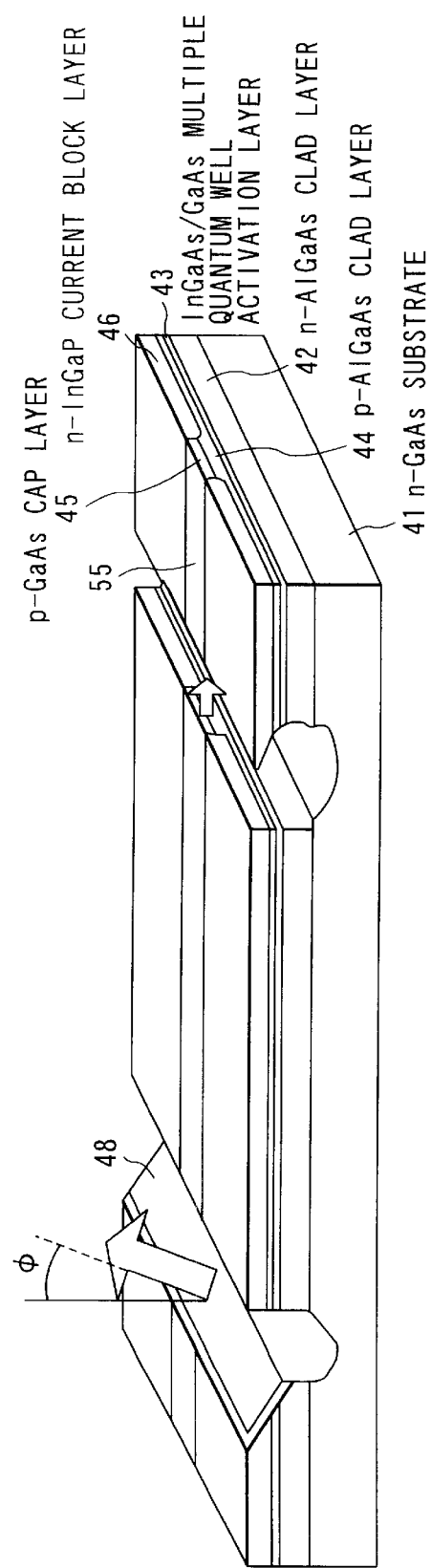
FIG. 5 is a diagram showing an example of a structure of a laser light source 10 acting as an edge emitting laser and having an external mirror and a monitor photodetector integrated therewith as an optical element in FIG. 4.

FIG. 5 shows an example of a structure of the laser light source 10 acting as an edge emitting laser and having the external mirror and the monitor photodetector integrated therewith as the optical element.

The laser light source 10 is configured as described below.

The n-AlGaAs clad layer 42, an InGaAs/GaAs multiple quantum well active layer (30 nm in total thickness) 43, the p-AlGaAs clad layer 44, and the p-GaAs cap layer 45 are sequentially formed on the n-GaAs substrate 41 acting as the semiconductor substrate 1a.

The n-GaInP current block layer 46 is filled around a stripe portion 55 of width 3 μm.

In addition, the refractive-index difference Δn between the active layer 43 and the AlGaAs clad layers sandwiching the layer 43 is 0.18, and the beam divergence is 18° in the vertical direction and 10° in the horizontal direction.

Dry etching is used to set a monitor-side opposed surface so that beams are irregularly reflected from this surface to an etched bottom surface, while the other surface, that is, an optical-output-side opposed surface is inclined through 50°.

This reflection surface has a high-reflection film (reflection surface) 48 provided thereon surface as the external mirror so that light beams emitted from the laser are reflected from the reflection surface 48 and applied to the scale 2 in a fashion being inclined in the normal direction through 100 from the optical element surface.

In this case, when the resonator length is set between 300 and 500 μm, the expected optical output is 30 mW or more.

In fact, the high-reflection film (reflection surface) 48 acting as the external mirror causes a beam spot diameter to extend at a laser end surface, whereby the beam divergence (angle) in the beam major-axis direction is expected to be smaller than 18°. Additionally, since the optical output is 30 mW, the S/N ratio of the photodetector is equivalent to that in the use of a vertical cavity surface emitting laser as the light source.

Fourth Embodiment

Next, an optical sensor according to a fourth embodiment of the present invention will be described with reference to FIGS. 6A and 6B.

Figure 6B:
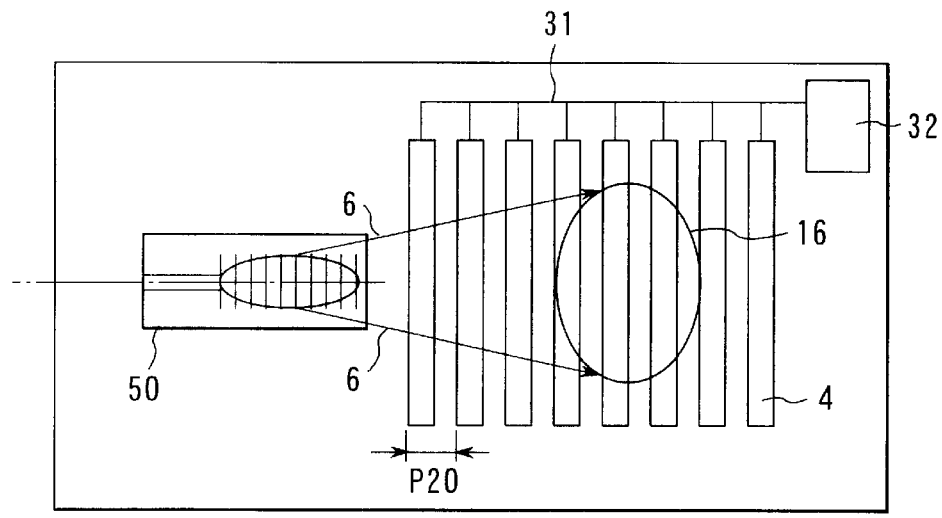
FIG. 6B is schematic top view of the optical sensor main body 1 in FIG. 6A with the scale 2 omitted.
Figure 6A:
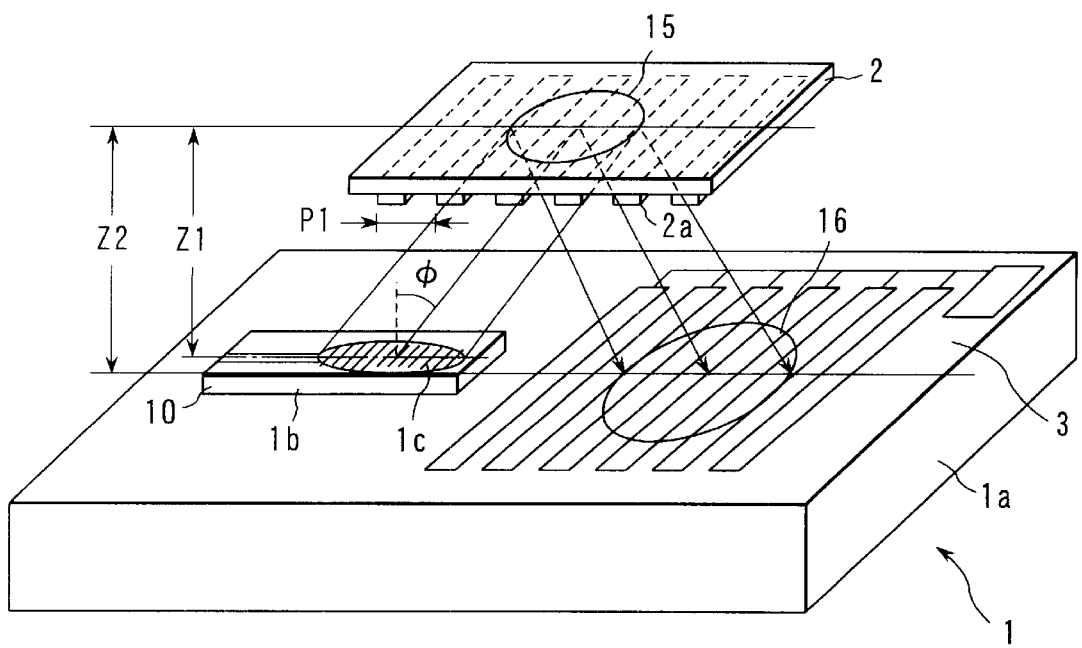
FIG. 6A is perspective view showing a configuration of an optical sensor according to a fourth embodiment of the present invention.

FIG. 6A is a perspective view showing a configuration of the optical sensor according to the fourth embodiment. FIG. 6B is a schematic top view of the optical sensor main body 1 in FIG. 6A with the scale 2 omitted.

In the following description, some of the parts common to the first embodiment will be omitted.

The laser light source 10 integrally formed by providing the grating 1c in the waveguide 1c according to this embodiment is expected to provide a more stable oscillation wavelength than the vertical cavity surface emitting laser.

In the example shown in FIGS. 6A and 6B, the beam spot diameter is about 250 μm in a direction perpendicular to a laser junction surface and is about 5 μm, that is, the stripe width plus 1 to 2 μm in the horizontal direction taking into account impregnation of light in a lateral direction relative to the laser junction surface.

Accordingly, emitted beams do not substantially extend in the direction perpendicular to the laser junction surface, whereby the beam divergence can be maintained at about 10° in the horizontal direction. Additionally, the optical output is expected to be about 10 mW.

Next, the operation of the fourth embodiment will be explained.

First, light beams from the laser light source 10 are inclined through the angle φ from the surface of the grating 1c before being applied to the scale 2 as parallel beams.

The scale 2 has the diffraction grating 2a formed in accordance with a cycle corresponding to the pitch p1 and in a fashion traversing the parallel beams.

The spot diameter on the scale 2 is equal to the spot diameter on the grating 1c of the laser light source 10.

Since the photodetector 3 is provided on the same side as the laser light source 10, the z1 and z2 are almost the same if the scale is of a reflection type. Thus, by setting the z1 so as to meet Equation (3), the diffraction interference pattern on the scale 2 in the scale moving direction is reproduced on the photodetector 3.

If the cycle pitch p20 of a light receiving section of the photodetector 3 equals the pitch p1 of the difference grating on the scale, variations in displacement can be detected on a one-to-one basis.

When the inclination is large, that is, 10° or larger, the optical path length varies significantly with the position in the diffraction interference pattern on the light receiving surface. As a result, Equation (3) is not met and the periodicity and visibility of the diffraction interference pattern on the light receiving surface decrease.

Thus, in practical terms, when the inclination $\phi$ of the light beams from the laser light source 10 is between about 5 and 10°, the decrease in the periodicity and visibility of the diffraction interference pattern on the light receiving surface can be minimized.

Fifth Embodiment

Figure 7B:
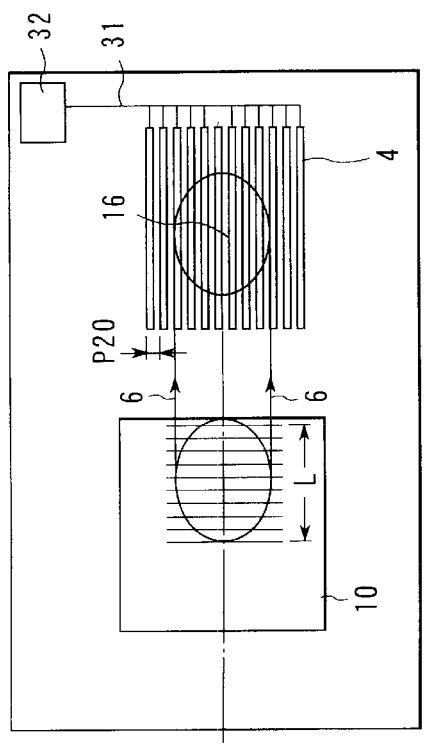
FIG. 7B is schematic top view of the optical sensor main body 1 in FIG. 7A with the scale 2 omitted.

Next, an optical sensor according to a fifth embodiment of the present invention will be described with reference to FIGS. 7A and 7B.

Figure 7A:
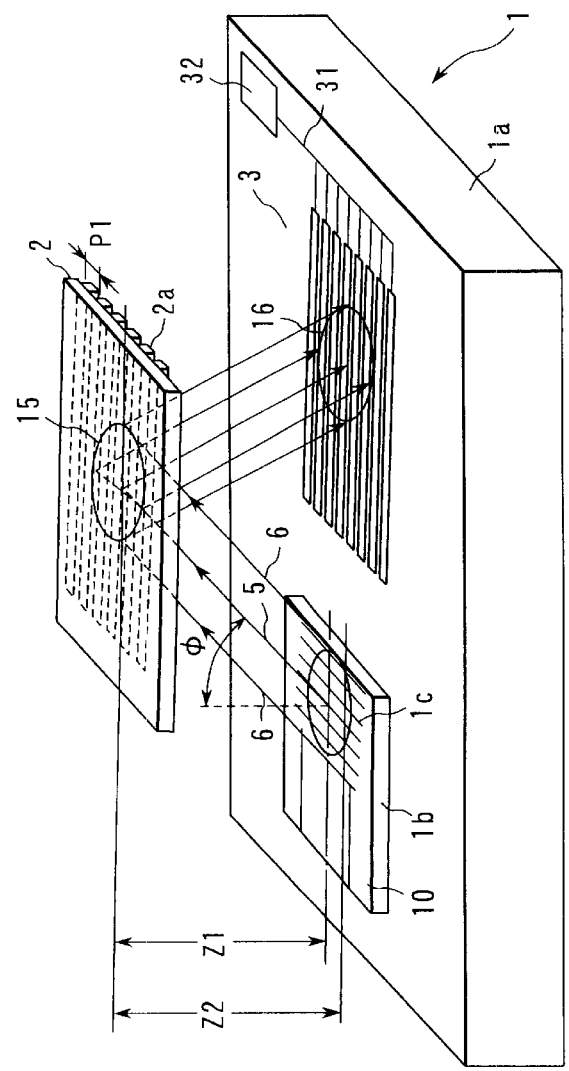
FIG. 7A is perspective view showing a configuration of an optical sensor according to a fifth embodiment of the present invention.
Figure 8:
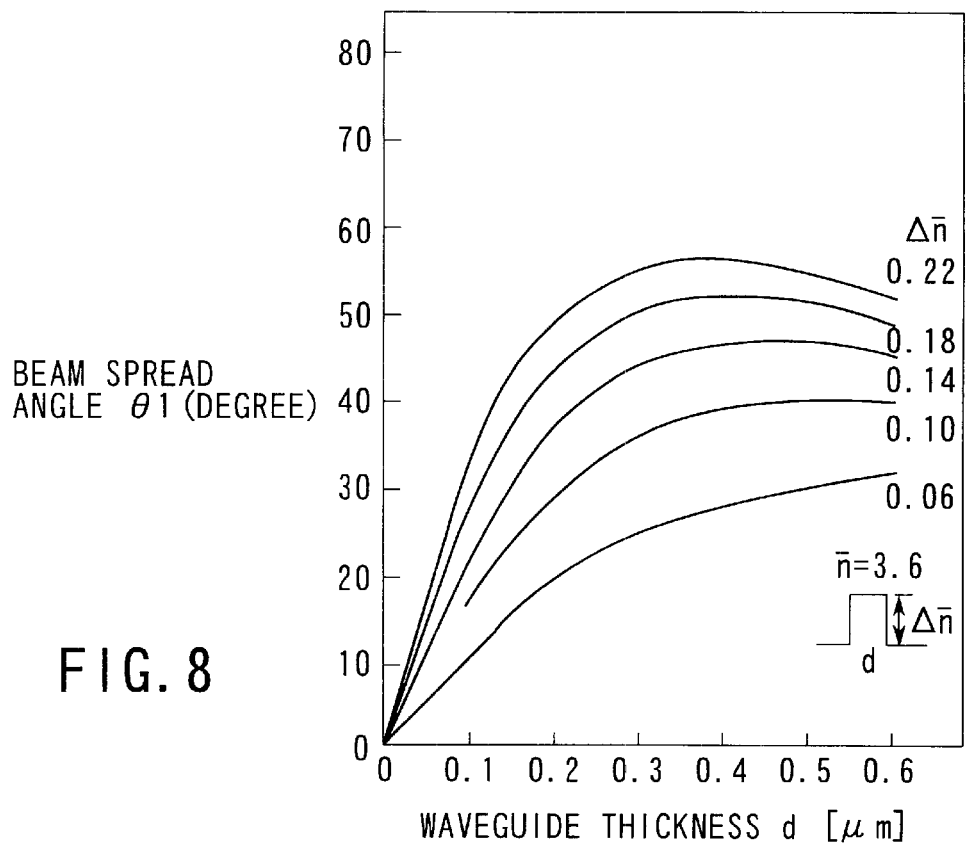
FIG. 8 is a diagram showing a beam divergence angle plotted using as parameters a waveguide thickness d and a refractive-index difference Δn between the waveguide area and areas sandwiching the waveguide area.
Figure 10:
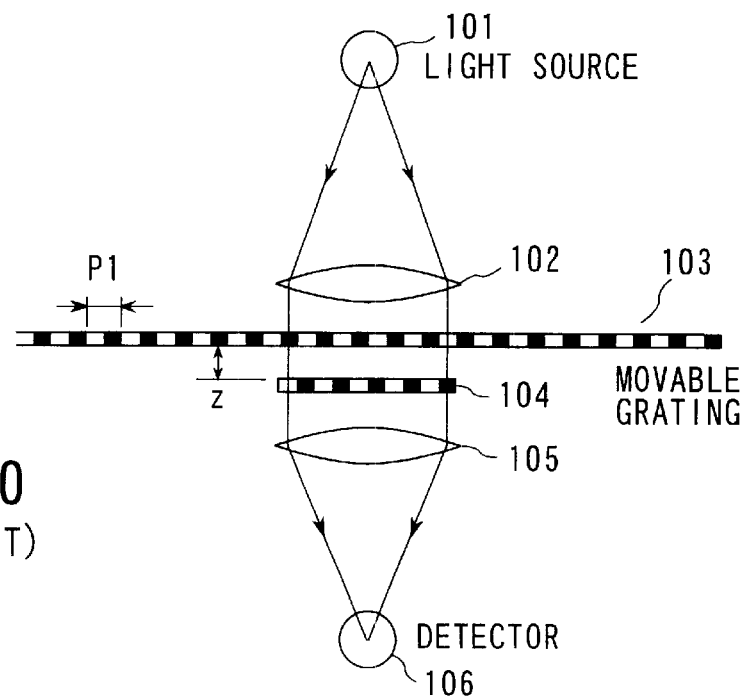
FIG. 10 is a diagram useful in describing the principle on which the displacement sensor is based when a diffraction grating is irradiated with parallel beams.

FIG. 7A is a perspective view showing a configuration of the optical sensor according to the fifth embodiment. FIG. 7B is a schematic top view of the optical sensor main body 1 in FIG. 7A with the scale 2 omitted.

In the following description, some of the parts common to the first embodiment will be omitted.

In the laser light source 10 according to the fifth embodiment, the width of the grating 1c (50) is set at about 100 $\mu$m, compared to a typical value of several $\mu$m as shown in FIG. 1A (FIG. 2).

Thus, an emission pattern on the surface of the grating 1c comprises parallel beams both in the major-axis direction and in the minor-axis direction, so that the displacement of the scale 2 can be detected whichever direction the diffraction grating 2a on the scale 2 traverses light beams.

In this embodiment, a spot pattern on the surface of the grating 1c substantially equals a light beam spot pattern 15 on the scale 2 and a light beam spot pattern 16 on the photodetector 3.

Consequently, the pitch pi of the diffraction grating 2a on the scale 2 which traverses the minor-axis direction of light beams must be sufficiently small.

On the other hand, in the displacement sensor configured as described above, the distance z1 between the laser light source 10 and the scale 2 may have an large integral value k that meets Equation (3), thereby realizing a very accurate optical displacement sensor.

The fourth embodiment corresponds to an embodiment of the aspect of the present invention set forth in claim 5, described later, and its operation and effects will be described below.

The grating area must be at least 100 $\mu$m in order to allow the grating in the waveguide to emit beams in a predetermined direction.

Then, the beams do not substantially spread in this direction, and the beam divergence can be set based on the waveguide width.

To minimize an operating current for the light source, the stripe width 55 in the laser area is set at several $\mu$m.

If parallel beams in the grating direction are used to detect the displacement of the scale 2, the spot diameter on the scale 2 in its moving direction is substantially equal to a grating area length L.

Thus, to increase displacement detection accuracy, the grating area length L must be set to be large compared to the scale pitch p1.

Unlike the laser area, however, the grating contributes only to coupling to the waveguide, and the beams are not spread even if the grating area length L is significantly increased.

In this case, the parallel-beam spot 15 traversing a plurality of lines on the scale 2 is reflected to define the spot 16 on the photodetector 3.

Since the spot diameter is almost constant in the grating direction, the light intensity distribution in this direction agrees with the distribution of the light receiving areas 4 on the photodetector 3.

The fifth embodiment corresponds to an embodiment of the aspect of the present invention set forth in claim 6, described later, and its operation and effects will be described below.

The grating 1c area must be at least 100 $\mu$m in order to allow the grating 1c in the waveguide 1b to emit beams in a predetermined direction.

Then, the beams do not substantially spread in this direction, and the beam spot shape depends on the width of the stripe portion 55.

The fifth embodiment corresponds to the broad stripe portion 55 of width about 100 $\mu$m.

With such a broad-stripe structure in which the laser area of the laser light source with the grating 1c integrated therewith has a stripe width 55 of about 100 $\mu$m, the light beam diameter equals the light source emission spot, the spot 15 on the scale 2, and the spot 16 on the photodetector due to the parallel beams.

Consequently, the displacement of the scale 2 can be detected whether the scale 2 is located so as to traverse beams from the beam spot in the major- or minor-axis direction.

However, due to the operating current for the light source 1, the width of the stripe portion 55 cannot be substantially increased, so that the scale pitch p1 of 20 $\mu$m or less is practical.

As described above, the present invention can provide an inexpensive optical displacement sensor that can be assembled easily and that can sense the displacement of the scale accurately and reliably.

Additional advantages and modifications will readily occur to those skilled in the art. Therefore, the invention in its broader aspects is not limited to the specific details and representative embodiments shown and described herein. Accordingly, various modifications can be made without departing from the spirit or scope of the general inventive concept as defined by the appended claims and their equivalents.

What is claimed is:

1. An optical displacement sensor comprising:
   a laser light source which emits light beams having a predetermined beam shape;
   a scale that is displaced in a fashion traversing the light beams emitted from said laser light source and that includes a periodic pattern formed thereon to generate a diffractive interference pattern from the light beams;
   a photodetector which receives at least a portion of said diffractive interference pattern; and an optical element which refracts the light beams emitted from said laser light source to said scale, wherein:

said photodetector includes a photodetector array comprising plural light receiving areas having a period of $np1(z1+z2)/z1$ in a pitch direction of said diffractive interference pattern on a surface of said photodetector, a distance between a light beam emission surface of said laser light source and a surface of said scale is defined as $z1$, a distance between the surface of said scale and a light receiving surface of said photodetector is defined as $z2$, a pitch of the periodic pattern on said scale is defined as $p1$, and n denotes a natural number; and wherein said optical element includes a grating and the periodic pattern on said scale is substantially perpendicular to a pitch direction of the grating of said optical element.

2. An optical displacement sensor according to claim 1, wherein said laser light source comprises an edge emitting laser, and said optical element comprises a reflector.

3. An optical displacement sensor according to claim 1, wherein said optical element comprises a grating formed in a waveguide.

4. An optical displacement sensor according to claim 2, further comprising means for monitoring an output power of the laser beams.

5. An optical displacement sensor according to claim 3, wherein said predetermined beam shape is defined by said grating to be wide in a moving direction of said scale and to be narrow in a direction perpendicular to the moving direction of said scale.

* * * * *